(12) United States Patent
Takamatsu et al.

(10) Patent No.: US 6,617,592 B2
(45) Date of Patent: Sep. 9, 2003

(54) CHARGED PARTICLE BEAM SYSTEM AND CHAMBER OF CHARGED PARTICLE BEAM SYSTEM

(75) Inventors: Jun Takamatsu, Yokohama (JP); Kiyoshi Hattori, Yokohama (JP); Hitoshi Sunaoshi, Yokohama (JP); Naoharu Shimomura, Tokyo (JP); Kiminobu Akeno, Yokohama (JP); Munehiro Ogasawara, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/810,478

(22) Filed: Mar. 19, 2001

(65) Prior Publication Data

US 2001/0025931 A1 Oct. 4, 2001

(30) Foreign Application Priority Data

Mar. 30, 2000 (JP) ........................................ 2000-094573

(51) Int. Cl.$^7$ .................................................. A61N 5/00
(52) U.S. Cl. ............................... 250/492.1; 250/492.2; 250/492.21; 250/492.22; 250/492.3; 250/491.1
(58) Field of Search ........................... 250/492.1, 491.1, 250/492.2, 492.21, 492.22, 492.3

(56) References Cited

U.S. PATENT DOCUMENTS

| | | | |
|---|---|---|---|
| 3,648,048 A | * | 3/1972 | Cahan et al. .............. 250/49.5 |
| 4,785,187 A | * | 11/1988 | Kariya et al. ............. 250/491.1 |
| 5,101,301 A | * | 3/1992 | Iwase et al. ................ 359/872 |
| 5,786,601 A | * | 7/1998 | Sturrock et al. ......... 250/491.1 |
| 5,872,367 A | * | 2/1999 | Wolber et al. ........... 250/522.1 |
| 6,194,733 B1 | * | 2/2001 | Haas et al. ............... 250/492.2 |
| 6,480,260 B1 | * | 11/2002 | Donders et al. .............. 355/53 |
| 6,485,153 B2 | * | 11/2002 | Ota ............................ 359/859 |

* cited by examiner

Primary Examiner—John R. Lee
Assistant Examiner—Dail A. Vanore
(74) Attorney, Agent, or Firm—Oblon, Spivak, McClelland, Maier & Neustadt, P.C.

(57) ABSTRACT

A charged particle beam system includes a chamber having an opening in a ceiling, a table placed immediately below the opening and movable in one direction, a laser interferometer set in the chamber, including a laser oscillator placed along the moving direction of the table, a movable mirror placed on the table side opposing the oscillator, a beam splitter placed to cross the laser beam and a fixed mirror fixed, immediately above the beam splitter, on the ceiling of the chamber, an optical lens barrel having an opening communicating with the opening of the chamber, and a beam gun set on a ceiling of the optical lens barrel to irradiate a specimen placed on the table with a charged particle beam through the first and second openings. At least an upper wall portion from the opening to the fixed mirror of the chamber is made of an invar alloy.

15 Claims, 3 Drawing Sheets

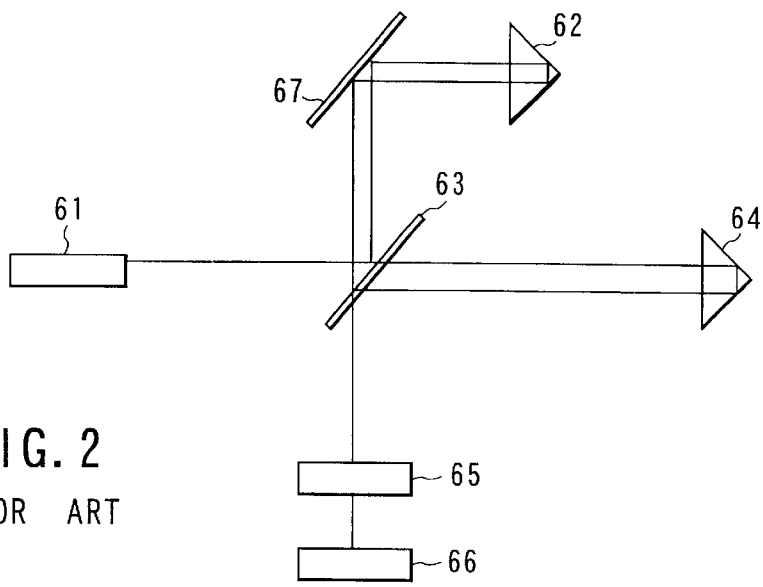
FIG. 2
PRIOR ART
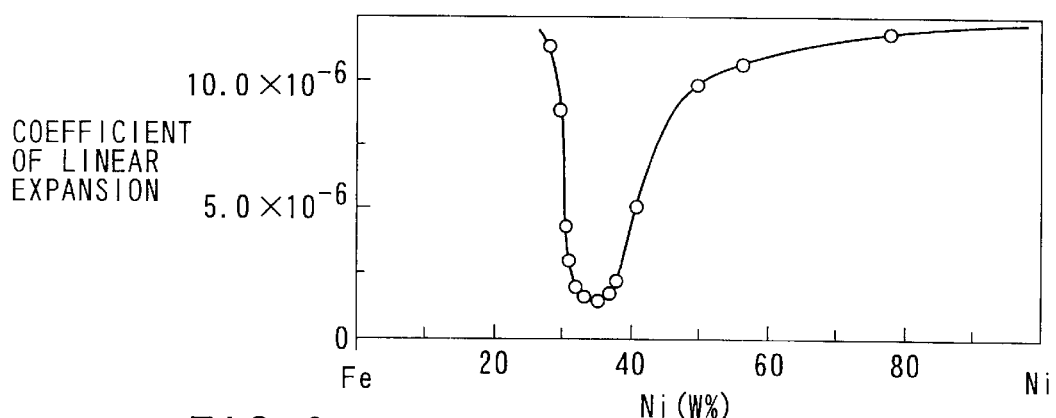
FIG. 3
|  | COEFFICIENT OF LINEAR EXPANSION $\alpha$ | MAGNETIC PERMEABILITY $\mu_0$ |
|---|---|---|
| STAINLESS STEEL | $15 \times 10^{-6}$ | --- |
| STEEL | $11 \times 10^{-6}$ | 200~300 |
| INVAR | $1.2 \times 10^{-6}$ | 2000~3000 |
| SUPER INVAR | $0.4 \times 10^{-6}$ | 2000~3000 |
| PERMALLOY PC | $11 \times 10^{-6}$ | ~70000 |
FIG. 4

CHARGED PARTICLE BEAM SYSTEM AND CHAMBER OF CHARGED PARTICLE BEAM SYSTEM

CROSS-REFERENCE TO RELATED APPLICATIONS

This application is based upon and claims the benefit of priority from the prior Japanese Patent Application No. 2000-094573, filed Mar. 30, 2000, the entire contents of which are incorporated herein by reference.

BACKGROUND OF THE INVENTION

The present invention relates to a charged particle beam system such as an electron beam lithography system used in pattern writing or pattern transfer to a substrate and, more particularly, to a chamber of this charged particle beam system.

As the integration degree of LSI devices increases, demands for the writing accuracy and throughput of a lithography system used in the fabrication of LSIs are becoming more and more strict. At present, a charged particle beam system such as an electron beam lithography system used as a lithography system employs lithography schemes such as a VSB (Variable Shaped Beam) scheme, CP (Character Projection) scheme, or pattern transfer scheme, in order to ensure sufficient throughput.

FIG. 1 is a schematic view of a VSB electron beam lithography system. This system will be described below in order. An electron beam emitted from an electron gun 51 enters into an electron optics system 50. More specifically, the electron beam passes through a condenser lens 52 and illuminates a first shaping aperture 53. This first shaping aperture 53 is, e.g., a rectangle 100 $\mu$m square. Hence, the electron beam passing through this first shaping aperture 53 is shaped into a square of 100 $\mu$m side.

The shaped electron beam is projected onto a second shaping aperture 56 through a projection lens 54. This second shaping aperture 56 is a square aperture of, e.g., 100 $\mu$m side. A beam shaping deflector 55 is disposed upstream of the second shaping aperture 56. The propagating direction of the electron beam can be changed by applying an appropriate voltage to this beam shaping apparatus 55. Consequently, the position of the first shaping aperture image projected onto the second shaping aperture 56 can be changed.

By thus changing the projection position, the overlap of the first shaping aperture image and the second shaping aperture changes, so square beams differing in size can be shaped. The beam shaped into a square is reduced by a reduction lens (not shown) and positioned by a sub deflector 57 and a main deflector 59. Furthermore, the focusing position of the beam is determined by an objective lens, and the beam arrives at a predetermined position of a specimen 60.

The specimen 60 can move by moving mechanisms called an X stage and Y stage. By these moving mechanisms, writing is performed by a step-and-repeat scheme or a continuous stage moving scheme. The continuous stage moving scheme will be described below. In this continuous stage moving scheme, a pattern to be written is divided into stripes, and each stripe is written. During the writing of each stripe, a stage (e.g., the X stage) is continuously moved. When one stripe is completely written, a stage (this time the Y stage perpendicular to the X stage) is moved one step by the width of a stripe to write the next stripe. In this way, an LSI pattern having a large writing area can be written efficiently at a high speed.

In this continuous stage moving scheme, the position of a specimen changes every moment, so this movement of each stage must be added to information about a position at which the beam should arrive. To this end, the position of each stage at each time must be accurately known. A laser interferometer is commonly used to measure this stage position.

FIG. 2 is a schematic view for explaining the principle of a laser interferometer. A laser beam emitted from a laser oscillator 61 is split into two directions by a beam splitter 63 and incident on a movable mirror 64 and a fixed mirror 62 via a reflective mirror 67. The laser beam reflected by the fixed mirror 62 and further by the reflective mirror 67 and the laser beam reflected by the movable mirror 64 merge on the beam splitter 63 to generate interference fringes. This interference component is detected by a detector 65 and analyzed by an analyzer 66 to find the position of the movable mirror 64.

This movable mirror 64 is set on a specimen stage. The fixed mirror 62 is fixed to, e.g., the ceiling of a chamber.

The position of this fixed mirror must always be fixed in the entire laser interferometer system. Otherwise, changes in the position of the movable mirror cannot be accurately detected any longer.

On the other hand, the walls of the chamber thermally expand or contract owing to temperature changes. Therefore, if the temperature of the environment in which the chamber is set changes, the position of the fixed mirror fixed to an inner wall of the chamber also changes.

This chamber is usually made of stainless steel. A coefficient $\alpha$ of linear expansion of stainless steel is $15 \times 10^{-6}/°$C. near a room temperature. This means that the linear expansion of 1-m long stainless steel is 15 $\mu$m/° C.

Assume that the temperature of the installation environment of the charged particle beam system is controlled within the range of ±0.1° C. In this state, a positional change of about ±0.225 $\mu$m occurs in a position apart by 150 mm from the center of the stainless steel chamber. Accordingly, the position of the fixed mirror fixed to this position also changes by 0.225 $\mu$m. As described above, the landing position of the electron beam is determined by referring to the stage position information. Consequently, an error corresponding to the positional change of the fixed mirror is produced, and this significantly degrades the writing accuracy. This is a fatal drawback for writing required to have a nanometer-level dimensional accuracy.

BRIEF SUMMARY OF THE INVENTION

It is an object of the present invention to reduce positional changes of a fixed mirror of a laser interferometer, which is fixed to an inner wall of a chamber, in accordance with temperature changes of a charged particle beam system.

To achieve the above object, a charged particle beam system according to the first aspect of the present invention comprises a chamber having a space to accommodate a specimen therein and a first opening to communicate with the space in an upper surface, a table placed, immediately below the first opening, on a bottom surface of the chamber, the table being movable in at least one direction, a laser interferometer set in the chamber, the laser interferometer comprising a laser oscillator placed along the one moving direction of the table, a movable mirror placed on that side surface of the table, which opposes the laser oscillator, a beam splitter placed on a line connecting the laser oscillator and the movable mirror, and a fixed mirror perpendicular to the line connecting the laser oscillator and the movable mirror and fixed, immediately above the beam splitter, on the upper surface of the chamber, an optical lens barrel having a second opening communicating with the first opening of the chamber, and coupled with the chamber so as to match the first and second openings, and a beam gun set on an inner upper surface of the optical lens barrel to irradiate the specimen placed on the table set on the bottom surface of the chamber with a charged particle beam through the first and second openings, wherein at least an upper wall portion from the opening to a fixed portion of the fixed mirror of the chamber is made of an invar alloy.

A charged particle beam system according to the second aspect of the present invention is characterized in that the chamber is made of an invar alloy in the arrangement of a charged particle beam system according to the first aspect.

A chamber of a charged particle beam system according to the third aspect of the present invention comprises a housing having a space to accommodate a specimen therein and an opening to communicate with the space in an upper surface, a table placed, immediately below the first opening, on a bottom surface of the housing, the table being movable in at least one direction, and a laser interferometer set in the housing, the laser interferometer comprising a laser oscillator placed along the one moving direction of the table, a movable mirror placed on that side surface of the table, which opposes the laser oscillator, a beam splitter placed on a line connecting the laser oscillator and the movable mirror, and a fixed mirror perpendicular to the line connecting the laser oscillator and the movable mirror and fixed, immediately above the beam splitter, on the upper surface of the housing, wherein at least an upper wall portion from the opening to a fixed portion of the fixed mirror of the housing is made of an invar alloy.

The above first to third aspects desirably have the arrangements such that the invar alloy is invar or super invar.

The laser interferometer further comprises a detector for receiving reflected light from the movable mirror and the fixed mirror via the beam splitter and detecting an interference component of the reflected light.

Also, in the first and second aspects, at least an under-half portion of the optical lens barrel are desirably made of an invar alloy.

In the present invention, a region of the chamber from the opening to a portion where the fixed mirror is set is made of a material, called an invar alloy, having a small coefficient of linear expansion. Therefore, it is possible to reduce positional changes of the fixed mirror of the interferometer caused by thermal expansion and contraction.

An alloy so-called invar is one material having a small thermal expansion coefficient near a room temperature. Invar is an iron alloy containing about 36 wt % of nickel.

FIG. 4 is a graph showing a coefficient α of linear expansion which changes in accordance with an amount of nickel added to iron. This graph shows that the coefficient of linear expansion of an iron alloy containing about 36 wt % of nickel is low. The coefficient α of linear expansion near a room temperature of this 36 nickel-iron alloy is about $1.2 \times 10^{-6}/°$ C. (FIG. 3). Likewise, an iron alloy so-called super invar containing 32 wt % of nickel and 5 wt % of cobalt has a very small coefficient of linear expansion of about $0.4 \times 10^{-6}/°$ C. These invar and super invar are generally called invar alloys.

Also, the chamber is used as a vacuum vessel. Therefore, the material of the chamber must well resist the atmospheric pressure or the weights of parts mounted on the upper portion of the chamber. Additionally, the material must have satisfactorily small degassing to maintain high-quality vacuum. Furthermore, the material is required to be processable into the shape of a vessel and allow vacuum flanges and ports to be attached. An invar alloy has sufficient rigidity and hence has sufficient strength even when used as a vacuum vessel.

The present invention is characterized in that the whole chamber or a region of the chamber from the opening to a portion where the fixed mirror is set is made of invar or super invar described above, and the fixed mirror as a component of the interferometer is fixed to this material.

In the present invention, the chamber is manufactured using invar or super invar having thermal expansion much smaller than stainless steel or iron. Particularly, the fixed mirror of the parts of the interferometer is fixed to an inner wall of this chamber. Accordingly, positional changes of the fixed mirror caused by thermal expansion of the chamber can be made one or more orders of magnitude smaller than that of a conventional stainless steel or iron chamber.

Since the stage positional information can be accurately known in this way, high-accuracy lithography can be performed without being influenced by environmental temperature changes. For example, assume that a fixed mirror is set in a position 150 mm away from the center of a super invar chamber. If an environmental temperature change is ±0.1° C., a positional change by thermal expansion is ±6 nm. This value is 1/40 a positional change of ±0.25 μm of the above-mentioned stainless steel chamber.

This positional change of about ±6 nm has no large influence on the accuracy of photolithography required to have a nanometer-level dimensional accuracy. Therefore, high-accuracy photolithography is implemented regardless of the environmental temperature.

Another effect of the use of invar or super invar is the magnetic shielding effect. No magnetic shielding effect can be obtained by the conventional stainless steel chamber in a static field, because the magnetic permeability of stainless steel is small. Hence, permalloy as a high-magnetic-permeability material is pasted on the inner or outer walls of the chamber. The thickness of the permalloy plate is usually about 1 mm. This can suppress deterioration of the photolithography accuracy occurring when the orbit of an electron beam is changed by an environmental magnetic change.

The magnetic permeability μ of invar or super invar is 2,000 to 3,000 (FIG. 4). This value is 10 times or more the magnetic permeability of iron. Therefore, a magnetic shielding effect much superior to that of the iron chamber can be realized. On the other hand, this magnetic permeability is one order of magnitude smaller than that of permalloy. However, the wall thickness of the invar chamber is about a few cm to 10 cm in order to give the chamber a function as a vacuum vessel. This makes it possible to obtain a magnetic shielding effect equal to that obtained when a permalloy plate about 1 mm thick is used.

BRIEF DESCRIPTION OF THE SEVERAL VIEWS OF THE DRAWING

FIG. 2 is a schematic view for explaining the principle of a laser interferometer;

FIG. 3 is a graph showing the relationship between an amount of nickel added to iron and a coefficient of linear expansion;

FIG. 4 is a table showing coefficients of linear expansion and magnetic permeability values of invar and the like;

DETAILED DESCRIPTION OF THE INVENTION

Embodiments of the present invention will be described below with reference to the accompanying drawings.
(First Embodiment)

Figure 1:
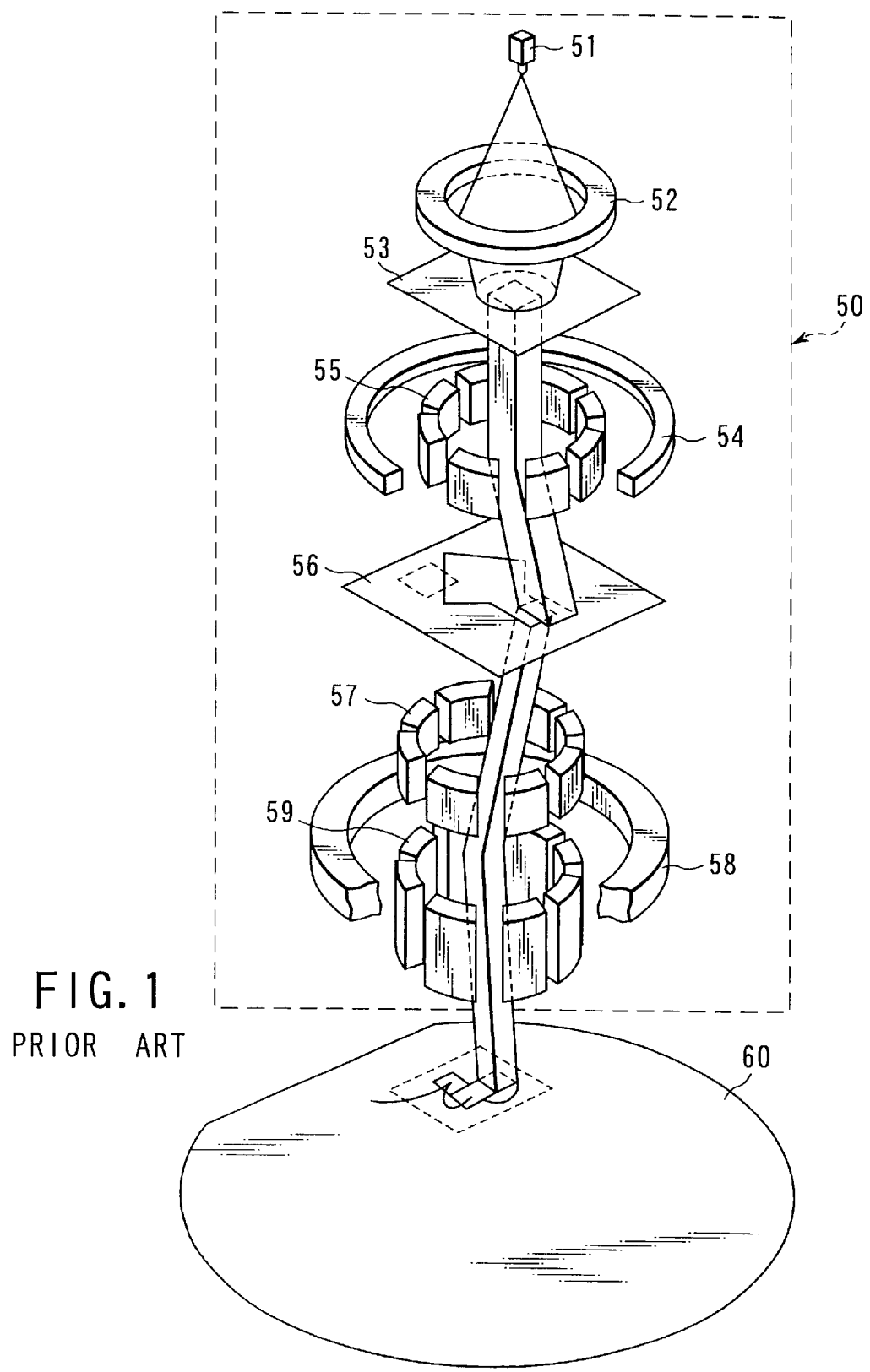
FIG. 1 is a schematic view showing a conventional VSB charged particle beam system.
Figure 5:
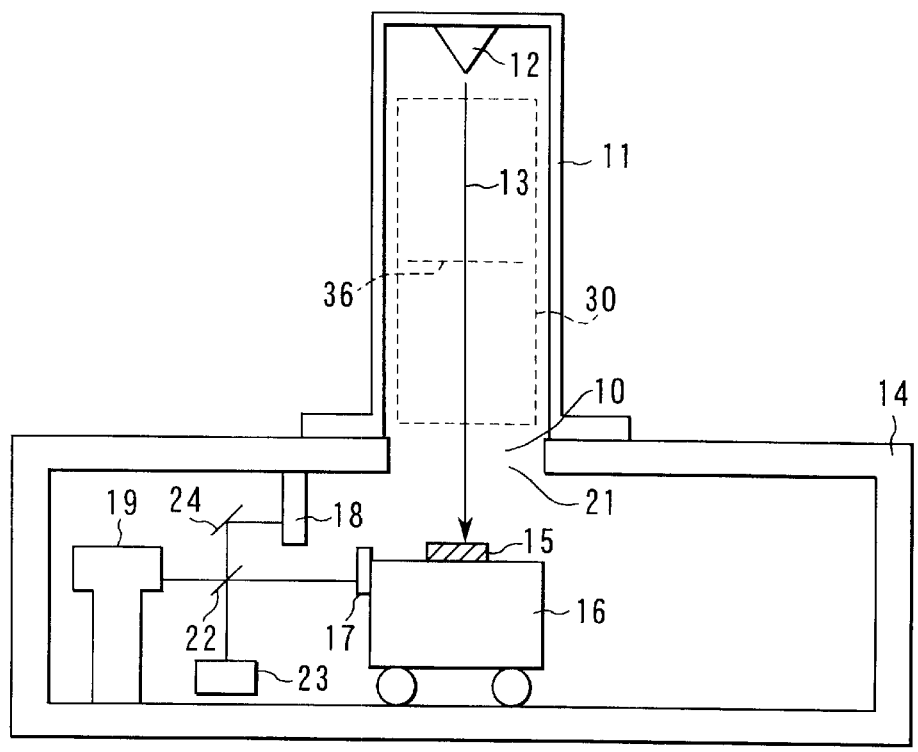
FIG. 5 is a schematic sectional view of a charged particle beam lithography system according to the first embodiment of the present invention.

FIG. 5 is a schematic sectional view of a charged particle beam lithography system according to the first embodiment of the present invention. In an upper portion of the chamber 14, there is provided an opening to which an electron-optical lens barrel 11 having an opening at one end thereof is connected, such that the opening of the barrel 11 is aligned with the opening of the chamber 14. A beam gun 12 is provided on a ceiling of the barrel 12 located at the other end thereof, and emits a charged particle beam 13. Although a detailed illustration is omitted, an electron optics system 30 similar to the electron optics system 50 shown in FIG. 1 is provided to control a shape and a direction of the charged particle beam 13. The electron optics system 30 includes a second shaping aperture 36 provided at a substantially central portion of the barrel 11.

Just under the opening 21 of the chamber 14, there is provided a table 16 which is made movable at least in one direction and on which a specimen 15 is mounted. On a side surface of the table 16, a movable mirror 17 is attached. A laser oscillator 19 is provided in the chamber 14 so as to face the movable mirror 17. The table 16 is made movable at least along a direction to the laser oscillator 19. The fixed mirror 18 is attached to the ceiling of the chamber 14. The above-described movable mirror 17, fixed mirror 18 and laser source 19 form a laser interferometer system similar to that shown in FIG. 2, together with a beam splitter 22, reflective mirror 24, detector 23 and analyzer (not shown).

The dimensions of the chamber 14 manufactured using super invar are 700 mm×700 mm×500 mm (height), and the wall thickness of the chamber 14 is 50 mm. The distance from the fixed mirror 18 to a beam axis established when the charged particle beam 13 passes through the opening 21 is 150 mm. With this arrangement, as described previously, a dimensional accuracy error component caused by an environmental temperature change of ±0.1° C. is ±6 nm or less, so lithography having satisfactorily high accuracy can be performed.

In addition, since 50-mm thick super invar is used, a magnetic shielding effect better than obtained by an electromagnetic soft iron chamber can be obtained. Also, this magnetic shielding effect compares favorably with that obtained by a stainless steel chamber on which permalloy panels about 1 mm thick are pasted.

A specimen loading/unloading opening (not shown) is formed in a side wall of the chamber. This opening is coupled with a pre-chamber such as a load-lock chamber via a gate valve. In addition, an opening for evacuation is formed in the chamber, and this opening is connected to a turbo molecular pump, ion pump, or the like. The chamber also has several other openings.

To manufacture this chamber by using invar or super invar (to be generally referred to as an invar alloy hereinafter), the following steps are used. First, it is important to minimize the amounts of impurities, particularly phosphorous (P) and sulfur (S) in an invar alloy as a material, to pose no problem in a subsequent welding step. If the amounts of these impurities are large, a welded portion readily breaks or cracks. The amounts of phosphorus and sulfur as impurities are desirably 0.005 wt % or less and 0.002 wt % or less, respectively. This invar alloy is melted in a vacuum furnace, cooled, and forged or rolled into panels having desired sizes and shapes.

The resultant structures (the panels) are subjected to surface cutting and subsequent annealing. This annealing is performed to remove strain produced in the forging or rolling step and the cutting step. If this strain is unremoved, the characteristics of invar are sometimes not achieved. In the annealing step, the panels are heated to 950° C. over 1 hr and held at 950° C. in a vacuum furnace or (nitrogen) ambient furnace. The holding time at 950° C. need only be about 1 hr per 25 mm.

Subsequently, the panels are gradually cooled in the furnace. After being cooled to about 500° C., the panels are cooled by a forming gas (nitrogen gas+hydrogen gas) or nitrogen gas. When hydrogen gas is added, the panel surface is reduced and the metal surface appears. When only nitrogen is used, the panel surface is clouded. When this is the case, appropriate polishing need only be performed.

A vacuum housing is assembled by combining the invar alloy panels manufactured through the above steps.

First, as primary processing, openings for attaching a vacuum flange, gate valve, and specimen loading/unloading port are formed, surface processing (for obtaining a surface having high parallelism and high levelness) for fixing a table mounting seat is performed, various screw holes are formed, a leak checking groove is formed, and surface polishing is performed. The panels subjected to this primary processing are combined and welded into the shape of a housing. This welding is done by electron beam (EB) welding to allow the housing to have structurally high strength. Furthermore, TIGAW (Tungsten Inert Gas Arc Welding) is performed for panel joint portions of the inner walls of the housing in order to hold vacuum.

After these welding processes, annealing is again performed to remove strain produced by cutting of the openings and in the welding steps. The contents of this annealing step are the same as the first annealing step.

Subsequently, as secondary processing, TIGAW of conflat flanges is performed, and O-ring grooves are formed. In this TIGAW, an invar alloy is used as welding rods. When the flanges are manufactured using an invar alloy, welded portions between these flanges and the housing do not easily break or crack.

The housing surface is then buffed and subjected to plating such as Kanigen plating or nickel plating. Finally, the vessel is desirably again annealed at a temperature exceeding the magnetic transition point of an invar alloy (about 190° C. for invar and about 120° C. for super invar).

Although conflat flanges are usually manufactured using stainless steel, they can also be manufactured using an invar alloy. The use of invar flanges can suppress breakage or cracks in welded portions, which may occur in the annealing step.

(Second Embodiment)

Figure 6:
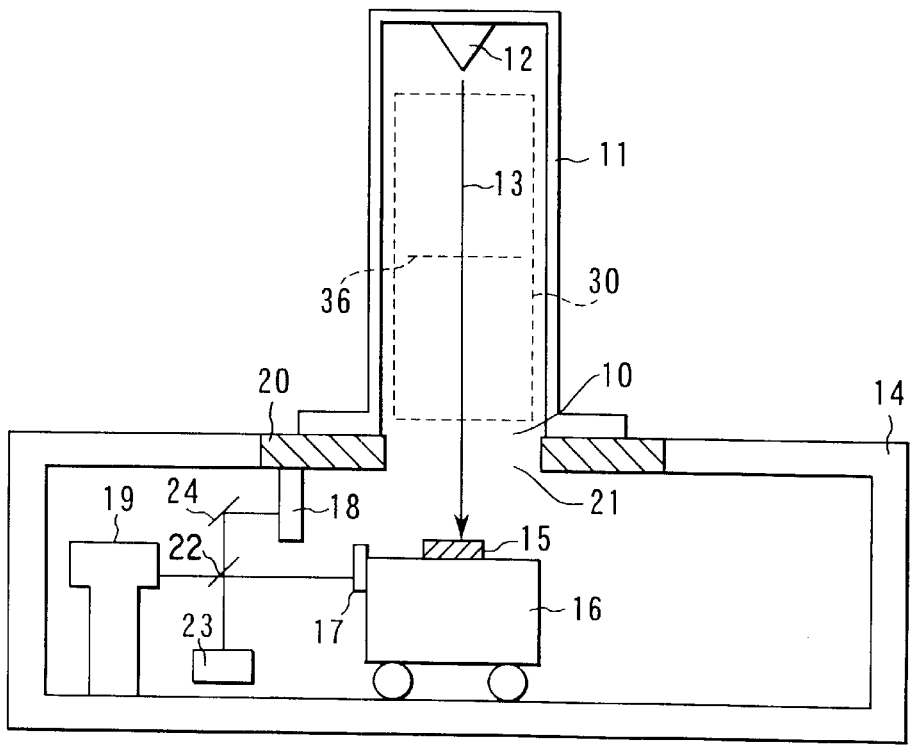
FIG. 6 is a schematic sectional view of a charged particle beam lithography system according to the second embodiment of the present invention.

The second embodiment of the present invention will be described below with reference to FIG. 6. In FIG. 6, the same components as in FIG. 5 are designated as the same reference numerals, and duplicated explanation therefor is omitted. This second embodiment is characterized in that a region (to be referred to as a mounting portion 20 hereinafter) of the ceiling of a chamber 14, from the periphery of the opening 21 for allowing the charged particle beam 13 to pass through to a portion where a fixed mirror is attached, is formed by an invar alloy. As in the first embodiment described above, this second embodiment can reduce changes in the position of the fixed mirror of a laser interferometer.

(Third Embodiment)

The third embodiment of the present invention will be described below. In this third embodiment, not only a chamber is manufactured by an invar alloy but also structural portions (for obtaining structural strength) of an electron-optical lens barrel (11 in FIG. 3) are manufactured by an invar alloy.

Conventionally, an electron-optical lens barrel is manufactured using electromagnetic soft iron or the like. This electromagnetic soft iron has magnetic permeability larger than those of stainless steel and regular steel. Hence, electromagnetic soft iron is used to improve the magnetic shielding effect. However, the coefficient of thermal expansion of electromagnetic soft iron is about $10 \times 10^{-6}/°$ C. Therefore, if an environmental temperature change of about ±0.1° C. occurs, an 800-mm long electron-optical lens barrel thermally expands by about ±0.8 µm.

The electron-optical lens barrel 11 tilts if the strengths of connections (commonly using bolts) between the electron-optical lens barrel 11 and a chamber 14 are nonuniform between the bolts. This tilt also changes the landing position of a charged particle beam. Assume, for example, that the diameter of the electron-optical lens barrel is 300 mm, and the distance from a main deflector as an objective deflector to a specimen surface, i.e., the distance from the ceiling of the chamber 14 to a specimen surface 15 is 100 mm. Under the conditions, assume the worst case in which only one side portion of the electron-optical lens barrel elongates. In this case, because a charged particle beam tilting from the original beam axis is incident on the specimen, a positional deviation is about 0.27 µm with respect to an elongation of 0.8 µm. This value is not permitted in lithography required to have nanometer-level dimensional control.

When the electron-optical lens barrel (at least a side portion between a beam gun and an opening facing the chamber) is manufactured using an invar alloy as in this third embodiment, it is possible to nearly eliminate a positional deviation resulting from tilting of the electron-optical lens barrel caused by an environmental temperature change. All the side portion of the electron-optical lens barrel is not necessarily made of an invar alloy. The same effect is obtained if a side portion of the barrel 11 under the second shaping aperture 36 in FIG. 5 (an under-half cylindrical portion of the barrel 11) is made of an invar alloy, for example. Also, an invar alloy has magnetic permeability one or more orders of magnitude larger than that of electromagnetic soft iron. This further enhances the magnetic shielding effect.

The present invention can significantly reduce deterioration of the lithography accuracy resulting from environmental temperature changes and can obtain a magnetic shielding effect larger than the conventional effect obtained using stainless steel or electromagnetic soft iron.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam system comprising:
    a chamber having a space to accommodate a specimen and a first opening to communicate with the space in an upper surface;
    a table placed, immediately below the first opening, on a bottom surface of the chamber, the table being movable in at least one direction;
    a laser interferometer set in the chamber, the laser interferometer comprising
        a laser oscillator placed along the one moving direction of the table,
        a movable mirror placed on that side surface of the table, which opposes the laser oscillator,
        a beam splitter placed on a line connecting the laser oscillator and the movable mirror, and
        a fixed mirror perpendicular to the line connecting the laser oscillator and the movable mirror and fixed, immediately above the beam splitter, on the upper surface of the chamber;
    an optical lens barrel having a second opening communicating with the first opening of the chamber, and coupled with the chamber so as to match the first opening and the second opening; and
    a beam gun set on an inner upper surface of the optical lens barrel to irradiate the specimen placed on the table set on the bottom surface of the chamber with a charged particle beam through the first opening and the second opening,
    wherein at least an upper wall portion from the opening to a fixed portion of the fixed mirror of the chamber is made of an invar alloy.

2. A system according to claim 1, wherein the invar alloy is invar.

3. A system according to claim 1, wherein the invar alloy is super invar.

4. A system according to claim 1, wherein the laser interferometer further comprises a detector for receiving reflected laser from the movable mirror and the fixed mirror via the beam splitter and detecting an interference component of the reflected laser.

5. A system according to claim 1, wherein at least an under-half cylindrical portion of the optical lens barrel is made of an invar alloy.

6. A charged particle beam system comprising:
    an invar alloy chamber having a space to accommodate a specimen and a first opening to communicate with the space in an upper surface;
    a table placed, immediately below the first opening, on a bottom surface of the chamber, the table being movable in at least one direction;
    a laser interferometer set in the chamber, the laser interferometer comprising a laser oscillator placed along the one moving direction of the table, a movable mirror placed on that side surface of the table, which opposes the laser oscillator, a beam splitter placed on a line connecting the laser oscillator and the movable mirror, and a fixed mirror perpendicular to the line connecting the laser oscillator and the movable mirror and fixed, immediately above the beam splitter, on the upper surface of the chamber;

an optical lens barrel having a second opening communicating with the first opening of the chamber, and coupled with the chamber so as to match the first opening and the second opening; and a beam gun set on an inner upper surface of the optical lens barrel to irradiate the specimen placed on the table set on the bottom surface of the chamber with a charged particle beam through the first opening and the second opening.

7. A system according to claim 6, wherein the invar alloy is invar.

8. A system according to claim 6, wherein the invar alloy is super invar.

9. A system according to claim 6, wherein the laser interferometer further comprises a detector for receiving reflected laser from the movable mirror and the fixed mirror via the beam splitter and detecting an interference component of the reflected laser.

10. A system according to claim 6, wherein at least an under-half cylindrical portion of the optical lens barrel are made of an invar alloy.

11. A chamber of a charged particle beam system, comprising:

a housing having a space to accommodate a specimen and an opening to communicate with the space in an upper surface;

a table placed, immediately below the first opening, on a bottom surface of the housing, the table being movable in at least one direction; and a laser interferometer set in the housing, the laser interferometer comprising a laser oscillator placed along the one moving direction of the table, a movable mirror placed on that side surface of the table, which opposes the laser oscillator, a beam splitter placed on a line connecting the laser oscillator and the movable mirror, and a fixed mirror perpendicular to the line connecting the laser oscillator and the movable mirror and fixed, immediately above the beam splitter, on the upper surface of the housing, wherein at least an upper wall portion from the opening to a fixed portion of the fixed mirror of the housing is made of an invar alloy.

12. A chamber according to claim 11, wherein the invar alloy is invar.

13. A chamber according to claim 11, wherein the invar alloy is super invar.

14. A chamber according to claim 11, wherein the laser interferometer further comprises a detector for receiving reflected laser from the movable mirror and the fixed mirror via the beam splitter and detecting an interference component of the reflected laser.

15. A charged particle beam system comprising:

a chamber having an upper wall with an opening, at least a part of the upper wall of the chamber close to the upper opening being made of an invar or an invar alloy;

a table supporting a specimen below the upper opening in the chamber, the table being at least movable to a first direction;

a beam gun irradiating a charged particle beam;

an optical lens system which directs the charged particle beam through the upper opening to the specimen on the table; and a laser interferometer associated with the table in the chamber, wherein the laser interferometer comprises:

a laser source irradiating a laser beam to the first direction;

a first mirror fixed on a side surface of the table, opposing to the laser source and being movable with the table;

a second mirror fixed to the part of the upper wall of the chamber;

a beam splitter which directs the laser beam from the laser source to both of the first mirror and the second mirror; and a detector which detects reflected laser beams from both of the first mirror and the second mirror.

* * * * *